United States Patent
Endo et al.

(10) Patent No.: US 10,490,582 B2
(45) Date of Patent: Nov. 26, 2019

(54) PHOTOELECTRIC CONVERSION DEVICE WITH INSULATING FILM CONTAINING NITROGEN

(71) Applicant: CANON KABUSHIKI KAISHA, Tokyo (JP)

(72) Inventors: Nobuyuki Endo, Fujisawa (JP); Masashi Kusukawa, Kawasaki (JP); Toshihiro Shoyama, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/821,617

(22) Filed: Nov. 22, 2017

(65) Prior Publication Data

US 2018/0151614 A1    May 31, 2018

(30) Foreign Application Priority Data

Nov. 29, 2016    (JP) ................. 2016-231769

(51) Int. Cl.
*H01L 27/146* (2006.01)
*H01L 29/423* (2006.01)

(52) U.S. Cl.
CPC .. *H01L 27/14614* (2013.01); *H01L 27/14616* (2013.01); *H01L 27/14689* (2013.01); *H01L 29/42364* (2013.01)

(58) Field of Classification Search
None
See application file for complete search history.

(56) References Cited

U.S. PATENT DOCUMENTS

| 6,610,615 | B1 * | 8/2003 | McFadden | ........ H01L 21/28202 |
| | | | | 438/776 |
| 7,728,330 | B2 | 6/2010 | Li | |
| 8,525,909 | B2 | 9/2013 | Matsumoto | |
| 8,786,044 | B2 | 7/2014 | Mishima | |
| 9,412,773 | B2 | 8/2016 | Hirota | |
| 2007/0052054 | A1 * | 3/2007 | Li | ............... H01L 27/14609 |
| | | | | 257/462 |
| 2007/0285543 | A1 | 12/2007 | Uchida | |
| 2008/0217660 | A1 * | 9/2008 | Aita | ................... H01L 27/1463 |
| | | | | 257/225 |

(Continued)

FOREIGN PATENT DOCUMENTS

JP    2006313899 A    11/2006
JP    2010056515 A    3/2010

*Primary Examiner* — Lex H Malsawma
(74) *Attorney, Agent, or Firm* — Canon U.S.A., Inc. IP Division

(57) ABSTRACT

A semiconductor device has a silicon layer having a photoelectric conversion portion, a transfer electrode of a transfer portion disposed on the silicon layer, the transfer portion transferring a charge of the photoelectric conversion portion, and an insulator film having a first portion located between the transfer electrode and the silicon layer and a second portion located on the photoelectric conversion portion, the first portion and the second portion of the insulator film contain nitrogen, oxygen, and silicon, and the distance between the position where the nitrogen concentration shows the largest value in the second portion and the silicon layer is larger than the distance between the position where the nitrogen concentration shows the largest value in the first portion and the silicon layer.

20 Claims, 7 Drawing Sheets

(56) References Cited

U.S. PATENT DOCUMENTS

| | | | |
|---|---|---|---|
| 2010/0026866 A1* | 2/2010 | Matsumoto | H01L 27/14609 348/308 |
| 2015/0090998 A1* | 4/2015 | Hirase | H01L 27/14614 257/40 |
| 2015/0200228 A1* | 7/2015 | Yao | H01L 27/14689 257/222 |

* cited by examiner

US 10,490,582 B2

PHOTOELECTRIC CONVERSION DEVICE WITH INSULATING FILM CONTAINING NITROGEN

BACKGROUND

Field of the Disclosure

The present technique relates to a semiconductor device.

Description of the Related Art

In a semiconductor device, a silicon oxynitride film is used for a gate insulating film in order to achieve both a gate capacity reduction inhibition and a tunnel current inhibition of the gate insulating film.

Japanese Patent Laid-Open No. 2010-56515 discloses a solid state image pickup device in which a gate insulating film of a MOS transistor of a pixel portion contains an oxynitride film and an oxide film is formed immediately above a photoelectric conversion portion of the pixel portion. Moreover, Japanese Patent Laid-Open No. 2010-56515 discloses leaving the gate insulating film immediately under a gate electrode and removing the gate insulating film of other regions.

SUMMARY

An aspect of the present disclosure is a semiconductor device having a silicon layer having a photoelectric conversion portion, a transfer electrode of a transfer portion disposed on the silicon layer, the transfer portion transferring a charge of the photoelectric conversion portion, and an insulator film having a first portion located between the transfer electrode and the silicon layer and a second portion located on the photoelectric conversion portion, the first portion and the second portion of the insulator film contain nitrogen, oxygen, and silicon, and the distance between the position where the nitrogen concentration shows the largest value in the second portion and the silicon layer is larger than the distance between the position where the nitrogen concentration shows the largest value in the first portion and the silicon layer.

Another aspect of the present disclosure is a method for manufacturing a semiconductor device, and the method includes forming a plurality of electrodes including a first electrode and a second electrode on an insulator film containing nitrogen, oxygen, and silicon disposed on a silicon layer, and, after forming the plurality of electrodes, growing silicon oxide between the insulator film and the silicon layer.

Further features of the present disclosure will become apparent from the following description of exemplary embodiments with reference to the attached drawings.

DESCRIPTION OF THE EMBODIMENTS

Figure 1A:
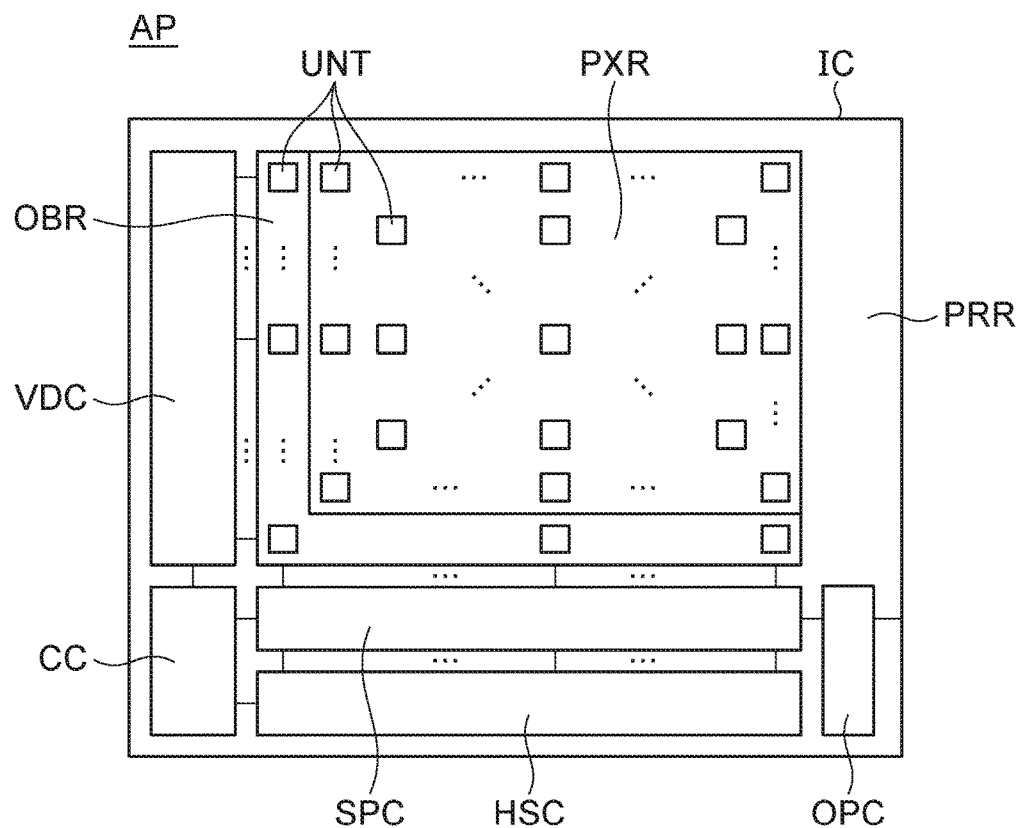
FIGS. 1A and 1B are schematic views explaining a semiconductor device, according to one or aspects of the current disclosure.

With the technique disclosed in Japanese Patent Laid-Open No. 2010-56515, the noise characteristics in the semiconductor device are not sufficiently taken into consideration. Therefore, the technique has a problem wherein a reduction in a dark current and white spot defects as the noise characteristics in the photoelectric conversion portion is not sufficient.

Accordingly, it is one object of the present disclosure to provide a technique advantageous in improving the noise characteristics in a semiconductor device.

The present technique is advantageous in improving the noise characteristics in a semiconductor device.

Hereinafter, embodiments for implementing the present disclosure are described with reference to the drawings. In the following description and the drawings, common configurations over the plurality of drawings are designated by common reference numerals. The common configurations are sometimes described mutually referring to the plurality of drawings without specified. Moreover, descriptions for the configurations designated by common reference numerals are sometimes omitted.

The configuration of a semiconductor device AP is described with reference to FIG. 1A. The semiconductor device AP is a photoelectric conversion device. The semiconductor device AP has a plurality of pixel circuits UNTs in a semiconductor chip IC. Each of the plurality of pixel circuits UNTs contains a photoelectric conversion portion disposed in a silicon layer. The pixel circuits UNTs are disposed in a light receiving region PXR and a light shielding region OBR of the semiconductor device AP. The semiconductor device AP can have a peripheral region PRR outside the pixel circuits UNTs. In the peripheral region PRR, a peripheral circuit performing at least one of driving of the pixel circuits UNTs and processing of signals output from the pixel circuits UNTs can be provided.

Figure 1B:
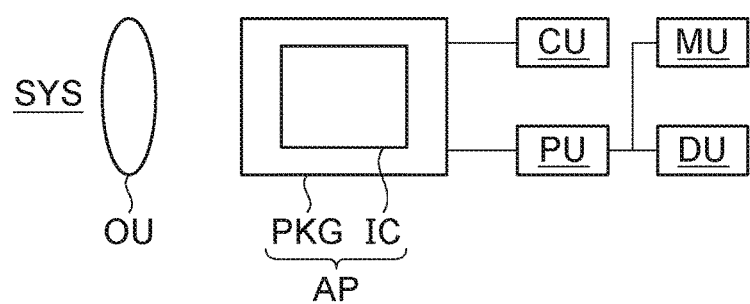

FIG. 1B illustrates an example of the configuration of an image pickup system SYS having the semiconductor device AP. The image pickup system SYS can further have at least any one of an optical system OU, a control device CU, a processing device PU, a display device DU, and a storage device MU. A description for the details of the image pickup system SYS is given later.

Figure 2:
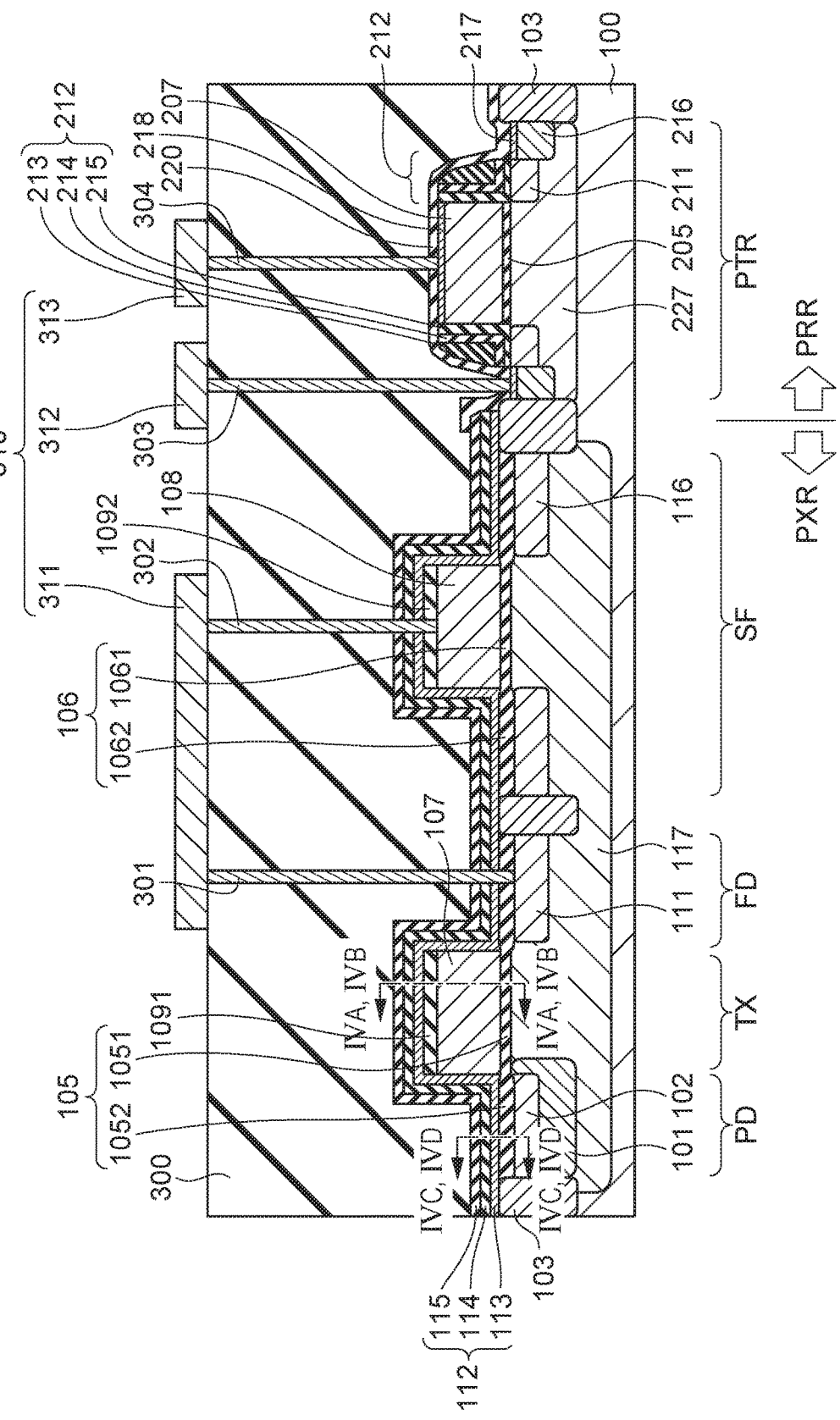
FIG. 2 is a schematic view explaining the semiconductor device, according to one or aspects of the current disclosure.

FIG. 2 is a cross-sectional view of an example of the semiconductor device AP. The pixel circuit UNT in the pixel region PXR contains a photoelectric conversion portion PD, a transfer portion TX, a charge holding portion FD, and an amplification transistor SF. The transfer portion TX transfers charges of the photoelectric conversion portion PD to the charge holding portion FD. The charge holding portion FD converts the transferred charges to a voltage according to the capacity of the charge holding portion FD. A structure in which the photoelectric conversion portion PD is a source, the transfer portion TX is a gate, and the charge holding portion FD is a drain can be referred to as a transfer transistor. The amplification transistor SF connected to the charge holding portion FD configures a source follower circuit. The pixel circuit UNT can contain, in addition thereto, a reset transistor resetting charges of the charge holding portion FD, a switch transistor switching ON and OFF of outputs from the pixel circuits UNTs, a discharge transistor discharging charges of the photoelectric conversion portion PD, and the like. Transistors (including the transfer transistor) contained in these pixel circuits UNTs can be collectively referred to as a pixel transistor. The plurality of pixel circuits UNTs can also share the pixel transistor. The number of at least any one of the photoelectric conversion portion PD, the transfer portion TX, and the charge holding portion FD provided in one pixel circuit UNT may be two or more. In the peripheral region PRR, a peripheral transistor PTR which is a MOS transistor is provided. The details of the peripheral transistor PTR are described later.

The semiconductor device AP has a silicon layer 100 in which the pixel transistor and the peripheral transistor are disposed. An element region (active region) of the silicon layer 100 is defined by an element isolation portion 103 having an STI structure or a LOCOS structure.

On the silicon layer 100, an interlayer insulating film 300 and contact plugs 301, 302, 303, and 304 penetrating the interlayer insulating film 300 are provided. On the interlayer insulating film 300, a wiring layer 310 containing circuit patterns 311, 312, and 313 is provided.

The silicon layer 100 has a photoelectric conversion portion PD. The photoelectric conversion portion PD is an embedded photodiode containing an N-type impurity region 101 serving as a charge accumulation region and a P-type impurity region 117 serving as a well. Hereinafter, the conductivity type of a semiconductor region in which charges having the same polarity as the polarity of signal charges are majority carriers is referred to as a first conductivity type and the conductivity type of a semiconductor region in which charges having a polarity different from the polarity of signal charges are majority carriers is referred to as a second conductivity type. When electrons are used as signal charges, the N-type is the first conductivity type. In the following description, electrons are used as signal charges but when holes are used as signal charge, the N-type may be read as the P-type and the P-type may be read as the N-type.

By providing a P-type impurity region 102 serving as a surface region between the surfaces of the impurity region 101 and the silicon layer 100, a structure in which the impurity region 101 is embedded in the silicon layer 100 is formed.

The transfer portion TX has a MOS gate structure. Therefore, the transfer portion TX can also be referred to as a transfer gate. The transfer portion TX having a MOS gate structure contains a transfer electrode 107 functioning as a gate electrode, an insulating portion 1051, and a semiconductor region in the silicon layer 100. The semiconductor region of the transfer portion functions as a channel region in which a transfer channel is formed. The transfer electrode 107 is disposed on the silicon layer 100. The insulating portion 1051 is located between the transfer electrode 107 and the silicon layer 100 and insulates the transfer electrode 107 from the silicon layer 100.

The charge holding portion FD has a diode structure formed by an N-type impurity region 111 functioning as a floating diffusion region and an impurity region 117 forming a PN junction with the impurity region 111.

The insulating portion 1051 of the transfer portion TX is a portion located between the transfer electrode 107 and the silicon layer 100 of the silicon oxynitride film 105. The silicon oxynitride film 105 has an extending portion 1052 and another extending portion in addition to the insulating portion 1051. The extending portion 1052 is a portion extending on the photoelectric conversion portion PD from between the transfer electrode 107 and the silicon layer 100 of the silicon oxynitride film 105. The another extending portion is a portion extending on the charge holding portion FD from between the transfer electrode 107 and the silicon layer 100 of the silicon oxynitride film 105.

The silicon oxynitride film 105 is a film of silicon oxynitride. The silicon oxynitride is a compound (silicon compound) containing oxygen (O), nitrogen (N), and silicon (Si) and is an insulator. Therefore, the silicon oxynitride film 105 is an insulator film containing oxygen (O), nitrogen (N), and silicon (Si). The silicon oxynitride film 105 can further contain other impurities other than oxygen (O), nitrogen (N), and silicon (Si). The impurities which may be contained in the silicon oxynitride film 105 include hydrogen (H), for example. It is preferable that carbon (C) is not contained in the silicon oxynitride film 105. The nitrogen concentration (at %) in the silicon oxynitride may be calculated as 100× (Number of nitrogen atoms)/(Number of oxygen atoms+Number of nitrogen atoms+Number of silicon atoms) % in disregard of elements serving as impurities. A silicon oxynitride in which the oxygen concentration is higher than the nitrogen concentration can be expressed as silicon oxide containing nitrogen. In the silicon oxide film containing nitrogen, the nitrogen may be unevenly distributed (localized) or may be omnipresent. A silicon oxynitride in which the nitrogen concentration is higher than the oxygen concentration can be expressed as a silicon nitride containing oxygen. However, these expressions are merely convenient expressions and do not deny that the nitrogen concentration of the silicon oxide containing nitrogen is lower than the oxygen concentration. In the silicon oxynitride film 105 suitable for this embodiment, the oxygen concentration is higher than the nitrogen concentration, and therefore the silicon oxynitride film 105 can be expressed as a silicon oxide film containing nitrogen.

The amplification transistor SF has a gate electrode 108 and a source/drain region 116. The source/drain region is a semiconductor region serving as a source and/or a drain. Even the same semiconductor region of the transistor sometimes serves as a source or sometimes serves as a drain depending on a driving method.

An insulating portion 1061 of the amplification transistor SF is a portion located between the gate electrode 108 and the silicon layer 100 of a silicon oxynitride film 106 and functions as a gate insulating film. The silicon oxynitride film 106 has an extending portion 1062 in addition to the insulating portion 1061. The insulating portion 1061 and the extending portion 1062 contain nitrogen. The extending portion 1062 is a portion extending on a source/drain region 116 from between the gate electrode 108 and the silicon layer 100 of the silicon oxynitride film 106. The gate electrode 108 of the amplification transistor SF is connected to the charge holding portion FD through the contact plug 301, the circuit pattern 311, and the contact plug 302.

A dielectric film 112 covering the photoelectric conversion portion PD, the transfer portion TX, and the charge holding portion FD is provided. The dielectric film 112 is located between the silicon layer 100 and the interlayer insulating film 300. The transfer electrode 107 is located between the dielectric film 112 and the silicon layer 100. The dielectric film 112 is a multilayer film containing a silicon oxide layer 113, a silicon nitride layer 114, and a silicon oxide layer 115. The dielectric film 112 may be a single layer film containing only the silicon nitride layer 114. The dielectric film 112 containing the silicon nitride layer 114 extends in such a manner that the gate electrode 108 of the amplification transistor SF is located between the dielectric film 112 and the silicon layer 100 to cover the amplification transistor SF.

This embodiment has a feature particularly in the silicon oxynitride film 105. Matters concerning the silicon oxynitride film 105 are described with reference to FIGS. 3A to 3C and 4A to 4D.

Figure 3A:
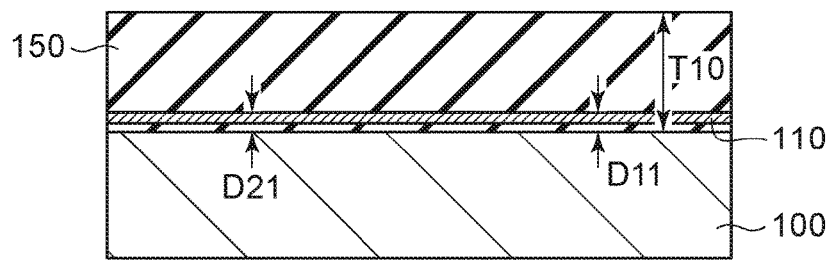
FIGS. 3A to 3C are schematic views explaining the semiconductor device, according to one or aspects of the current disclosure.
Figure 3B:
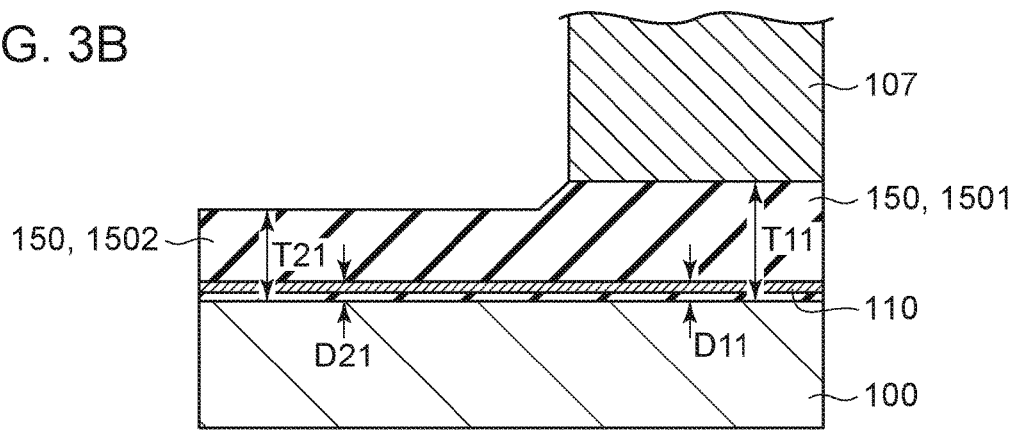
Figure 3C:
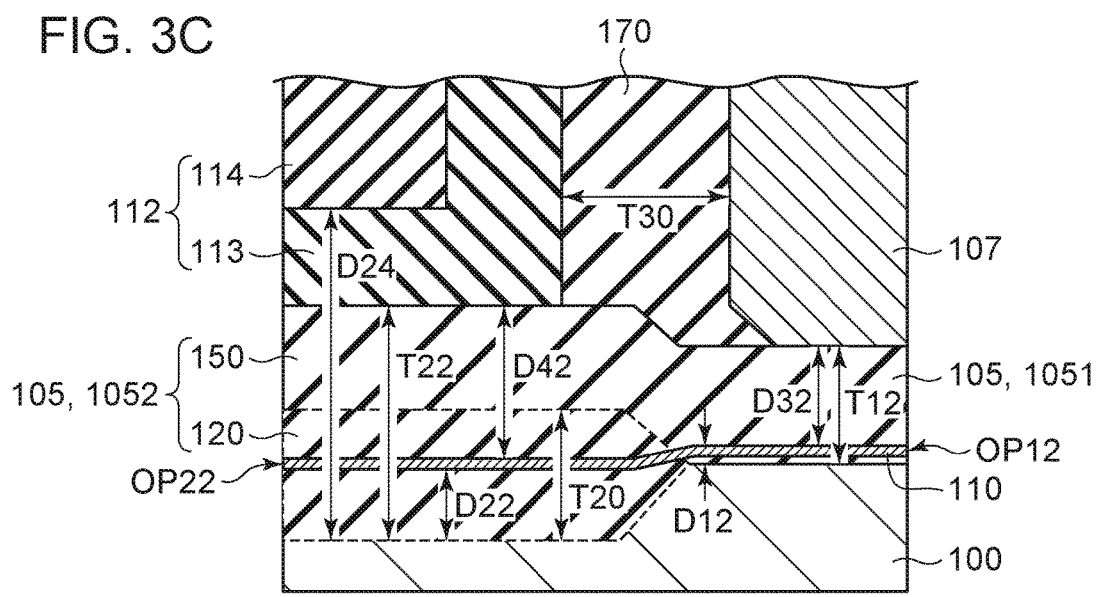

FIGS. 3A and 3B illustrate enlarged views near the surface of the silicon layer 100 during manufacturing of the semiconductor device AP. FIG. 3C illustrates an enlarged view near the surface of the silicon layer 100 of the completed semiconductor device AP.

FIG. 3C illustrates a nitrogen containing region 110 containing nitrogen of the insulating portion 1051 and the extending portion 1052 which are silicon oxides. In FIG. 3C, the nitrogen containing region 110 representatively indicates a position where the nitrogen concentration in the thickness direction shows the largest value with a direction (normal line direction) perpendicular to the surface of the silicon layer 100 as the thickness direction. More specifically, nitrogen is contained besides the portion illustrated as the nitrogen containing region 110 in the silicon oxynitride film 105 of FIG. 3C. As is understood from FIG. 3C, nitrogen is continuously distributed between the insulating portion 1051 and the extending portion 1052.

The position where the nitrogen concentration shows the largest value in the insulating portion 1051 is indicated as a position OP12. The distance between the position OP12 and the silicon layer 100 is indicated as a distance D12. The position where the nitrogen concentration shows the largest value in the extending portion 1052 is indicated as a position OP22. The distance between the position OP22 and the silicon layer 100 is indicated as a distance D22. The distance D22 is larger than the distance D12 (D22>D12). Thus, by keeping the nitrogen containing region 110 of the extending portion 1052 away from the photoelectric conversion portion PD, influence exerted by the nitrogen containing region 110 on the photoelectric conversion portion PD of the silicon layer 100 can be reduced. Therefore, white defects due to fixed charges caused by the nitrogen of the nitrogen containing region 110 can be reduced. The nitrogen containing region 110 in the insulating portion 1051 may be relatively closer to the silicon layer 100 than the extending portion 1052. This is because charges causing white defects are less likely to be generated in the transfer portion TX where no charges stay over a long time. It is also preferable that a thickness T22 of the extending portion is larger than a thickness T12 of the insulating portion 1051 (T22>T12). The same also applies to the amplification transistor SF illustrated in FIG. 2. More specifically, the thickness of the extending portion 1062 of the silicon oxynitride film 106 is larger than the thickness of the insulating portion 1061.

As illustrated in FIG. 3C, the distance from the silicon layer 100 to the silicon nitride layer 114 of the dielectric film 112 is designated by D24. The distance D24 is larger than the thickness T12 (D24>T12). The distance D24 is larger than the thickness T22 (D24>T22). By relatively reducing the thickness T12 of the insulating portion 1051, micronization of the transfer portion TX can be achieved, which is advantageous in an increase in the number of pixels or an increase in the area or the volume of the photoelectric conversion portion PD. By relatively increasing the thickness T22 of the extending portion 1052, the photoelectric conversion portion PD can be protected from damages in the formation of a dielectric film 112 disposed above the photoelectric conversion portion PD, for example. The distance D22 is smaller than the thickness T12 (D22<T12). The distance D22 is smaller than the thickness T22 (D22<T22). A distance D32 between the transfer electrode 107 and the nitrogen containing region 110 is equivalent to a difference between the thickness T12 and the distance D12 (D32=T12−D12). In this example, the nitrogen containing region 110 is located near the interface between the silicon layer 100 and a silicon oxynitride film 150 and the distance D12 is smaller than a distance D32 (D12<D32). When the nitrogen containing region 110 is located near the surface opposite to the surface on which the silicon layer 100 is provided of the silicon oxynitride film 150, the distance D12 may be larger than the distance D32 (D12>D32).

A distance D42 between the dielectric film 112 and the nitrogen containing region 110 is equivalent to a difference between the thickness T22 and the distance D22 (D42=T22−D22). The dielectric film 112 contacts the silicon oxynitride film 105, and therefore the distance D42 can also be said to the distance between the upper surface of the extending portion 1052 and the nitrogen containing region 110. In this example, the nitrogen containing region 110 is located near the interface between the silicon layer 100 and the silicon oxynitride film 150 and the distance D22 is smaller than the distance D42 (D22<D42). When the nitrogen containing region 110 is located near the surface opposite to the surface on which the silicon layer 100 is provided of the silicon oxynitride film 150, the distance D22 may be larger than the distance D42 (D22>D42).

As typical relationships between the distances and the thicknesses, D24>T22>T30>D42≥T20>T12=T11=T10>D32>T21>D22>D11=D12 is established. It is advantageous in an improvement of the noise characteristics to satisfy at least one size relationship of the relationships of the distances and thicknesses.

The structure of FIG. 3C is formed as follows. First, in a process α illustrated in FIG. 3A, the silicon oxynitride film 150 having a thickness T10 is formed on the silicon layer 100. The silicon oxynitride film 150 can be formed by thermally oxidizing the silicon layer 100 to grow the silicon oxide of a predetermined thickness, and then further thermally oxynitriding the silicon layer 100 to grow silicon oxynitride as the nitrogen containing region 110. In addition, the silicon layer 100 may be thermally oxidized to grow silicon oxide of a predetermined thickness, and then nitrogen may be introduced into the silicon oxide by plasma nitriding. When using the thermally oxynitriding method, the nitrogen containing region 110 is formed near the interface between the silicon layer 100 and the silicon oxynitride film 150. This is equivalent to the relationship of D12<D32 illustrated in FIG. 3C. When using the plasma nitriding method, the nitrogen containing region 110 is formed near the surface opposite to the surface on which the silicon layer 100 is provided of the silicon oxynitride film 150. This is equivalent to the relationship of D12>D32 illustrated in FIG. 3C. In the plasma nitriding method, the silicon layer 100 may be damaged by the plasma but the thermally oxynitriding method is advantageous in an improvement of the noise characteristics as compared with the plasma nitriding method in the respect that there are no damages by plasma.

Next, in a process β illustrated in FIG. 3B, a plurality of electrodes including the transfer electrode 107, a gate electrode 108 (not illustrated) of the amplification transistor SF, and the like are formed on the silicon oxynitride film 150. In the formation of the electrodes, an electrode material film, such as polysilicon, is formed on the silicon oxynitride film 150, and then the electrode material film is etched to thereby pattern the electrode material film into the plurality of electrodes. A thickness T11 of an insulating portion 1501 located between the transfer electrode 107 and the silicon layer 100 is almost the same as the thickness T10 (T11=T10). On the other hand, in the etching, the silicon oxynitride film 150 extending from between the transfer electrode 107 and the silicon layer 100 is sometimes overetched. Although the overetching is not indispensable, FIG. 3B illustrates a state where a thickness T21 of an extending portion 1502 is smaller than the thickness T10 (T10<T21) and the thickness T21 is smaller than the thickness T11 (T21<T11).

Thereafter, in a process γ reaching FIG. 3C, a silicon oxide portion 120 is grown between the silicon oxynitride film 150 and the silicon layer 100. A thickness T20 of the silicon oxide portion 120 is, for example, 1 to 100 nm, typically 5 to 50 nm, and preferably 5 to 20 nm. The growth of the silicon oxide portion 120 is performed by thermal oxidation oxidizing the silicon layer 100 by supplying oxygen to the surface of the silicon layer 100 through the silicon oxynitride film 150. Thus, the extending portion 1052 in which the nitrogen containing region 110 is separated from the silicon layer 100 by only the distance D22 is formed. The thickness T22 of the extending portion 1052 may be equivalent to the total of the thickness T21 of the extending portion 1502 and the thickness T20 of the silicon oxide portion 120 (T22=T21+T20) before the thermal oxidation in the process γ. The nitrogen containing region 110 near the surface of the silicon layer 100 in the silicon oxynitride film 150 may be located in the silicon oxide portion 120 by the growth of the silicon oxide portion 120 in the process γ. Therefore, a distance D42 between the upper surface of the silicon oxynitride film 105 and the nitrogen containing region 110 becomes larger than the thickness T21 of the extending portion 1502 before the growth of the silicon oxide portion 120 (D42>T21).

The silicon oxide portion 120 formed by the thermal oxidation may greatly grow on the silicon side relative to the silicon oxynitride film 150 side based on the surface of the silicon layer 100 under the insulating portion 1051. Therefore, the distance D22 between the silicon layer 100 and the nitrogen containing region 110 may become larger than the distance (equivalent to T20−D22) between the silicon oxynitride film 150 and the nitrogen containing region 110 in the extending portion 1052.

In connection with the growth of the silicon oxide portion 120, the nitrogen containing region 110 of the extending portion 1052 may slightly move relatively to the silicon layer 100 side than the nitrogen containing region 110 of the insulating portion 1051. Therefore, with respect to the nitrogen containing region 110 which is flat in FIG. 3B, FIG. 3C illustrates that the nitrogen containing region 110 is slightly bent. Thus, even when the nitrogen relatively moves, nitrogen may be continuously distributed between the insulating portion 1051 and the extending portion 1052.

In the process γ, the transfer electrode 107 is disposed on the insulating portion 1501 of the silicon oxynitride film 150, and therefore the transfer electrode 107 serves as a mask, so that the growth of the silicon oxide does not occur at all or hardly occurs in the greater region under the insulating portion 1501. Therefore, the thickness T12 of the insulating portion 1051 is hardly different from the thickness T11 of the insulating portion 1501 in the silicon oxynitride film 150 before the process γ (T12=T11). However, oxygen is likely to be supplied in the vicinity of an end portion of the transfer electrode 107, silicon oxide may grow on a bird's beak. When the transfer electrode 107 is polysilicon, the silicon oxide portion 170 grows by the oxidation of the process γ on the exposed surface (side surface) of the transfer electrode 107. FIG. 3C illustrates that the side surface of the transfer electrode 107 shifts in a direction of separating from the photoelectric conversion portion PD side by the growth of the silicon oxide portion 170. Thus, by separating the side surface of the transfer electrode 107 from the photoelectric conversion portion PD, the end portion having the bird's beak shape of the silicon oxide portion 120 is prevented from overlapping with the transfer electrode 107, so that the generation of a parasitic channel or a dark current can be prevented.

With respect to single crystal silicon which is the material of the silicon layer 100 and polycrystalline silicon (polysilicon) which is the material of the transfer electrode 107, the polycrystalline silicon has a higher oxidation rate. Moreover, while the silicon layer 100 is covered with the silicon oxynitride film 150 in the oxidation in the process γ, the side surface of the transfer electrode 107 is exposed to the atmosphere. Therefore, the thickness T20 of the silicon oxide portion 120 may become smaller than the thickness T30 of the silicon oxide portion 170 (T20<T30). By the growth of the silicon oxide portion 170, the gate length and the channel length of the transfer portion TX decrease, so that the threshold value of the transfer portion TX may decrease.

In a process δ after the process γ, the dielectric film 112 containing the silicon nitride layer 114 is disposed on the extending portion 1052 containing the silicon oxide portion 120 growing in the process γ. The distance D24 between the silicon nitride layer 114 and the silicon layer 100 is larger than the thickness T22 of the extending portion 1052 (D24>T22). Thus, by keeping the silicon nitride layer 114 away from the silicon layer 100 using the extending portion 1052 having the thickness T22, unfavorable influence, such as excessive stress, exerted by the silicon nitride layer 114 on the silicon layer 100 can be reduced. The distance D24 also includes a distance corresponding to the thickness of the silicon oxide layer 113. The distance D24 is preferably larger than the thickness T12 equivalent to the distance between the silicon layer 100 and the transfer electrode 107 (D24>T12). On the other hand, the silicon nitride layer 114 may function as an antireflection layer or may function as a hydrogen supply source for hydrogen-terminating a dangling bond of the silicon layer 100. Therefore, the distance D24 between the silicon nitride layer 114 and the silicon layer 100 is preferably set to be smaller than a thickness TM of the transfer electrode 107 (D24<TM). Since the transfer electrode 107 and an insulating member 1091 are located on the insulating portion 1051, a distance D14 between the silicon layer 100 and the silicon nitride layer 114 with the insulating portion 1051 interposed therebetween is larger than the distance D24 (D14>D24).

When the extending portion 1502 is removed until the silicon layer 100 is exposed by the overetching in the formation of the transfer electrode 107 (process β) or the additional etching after the formation of the gate electrode, the silicon layer 100 may be damaged. The same applies to a case where the extending portion 1052 is completely removed until the silicon layer 100 is exposed. Furthermore, the silicon layer 100 or the surface of the silicon layer 100 may be damaged also in the formation of the dielectric film 112. The damage causes a leakage current or a dark current.

By leaving the extending portion 1502 and the extending portion 1502, the noise characteristics can be improved.

Figure 4A:
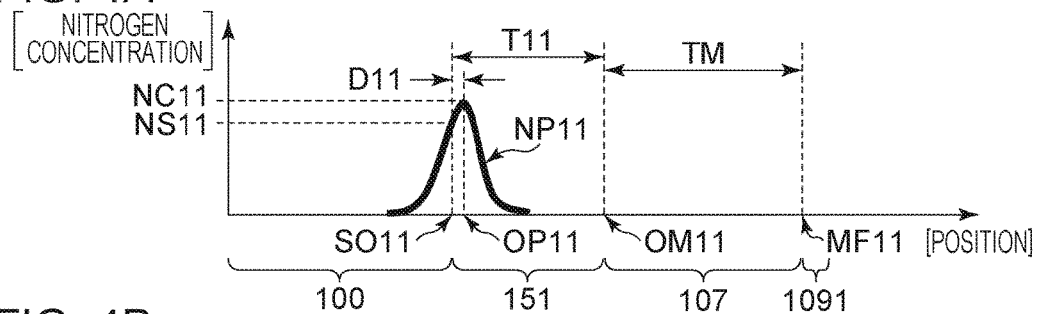
FIGS. 4A to 4D are schematic views explaining a method for manufacturing the semiconductor device, according to one or aspects of the current disclosure.
Figure 4B:
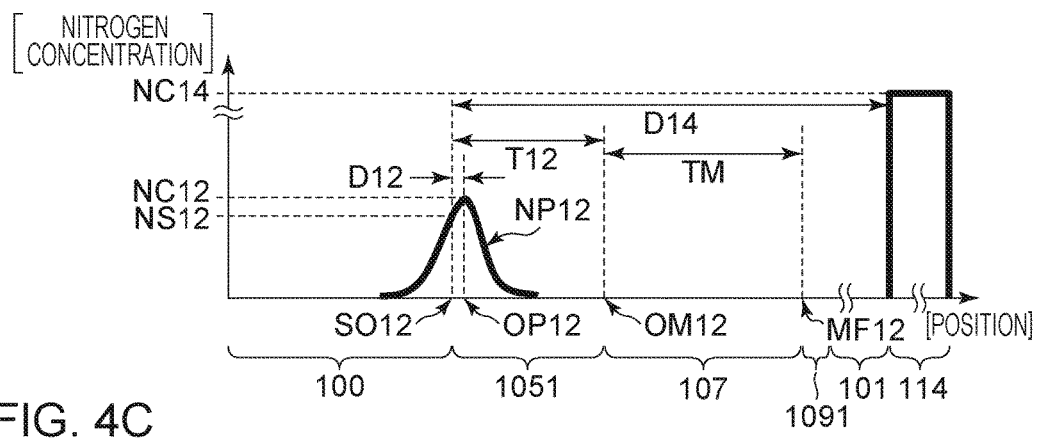
Figure 4C:
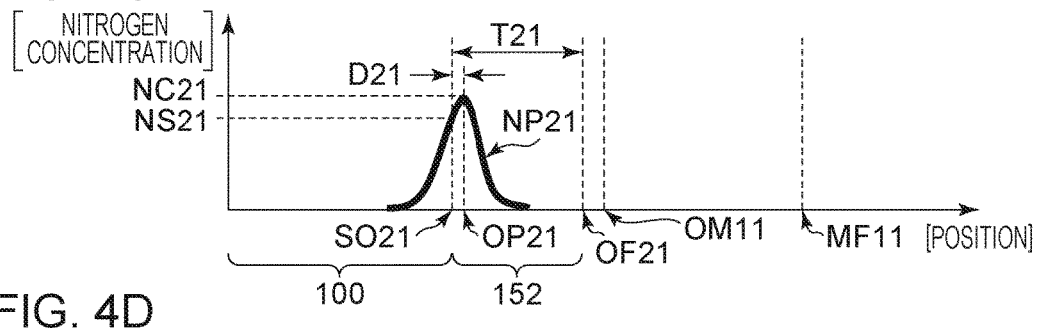
Figure 4D:
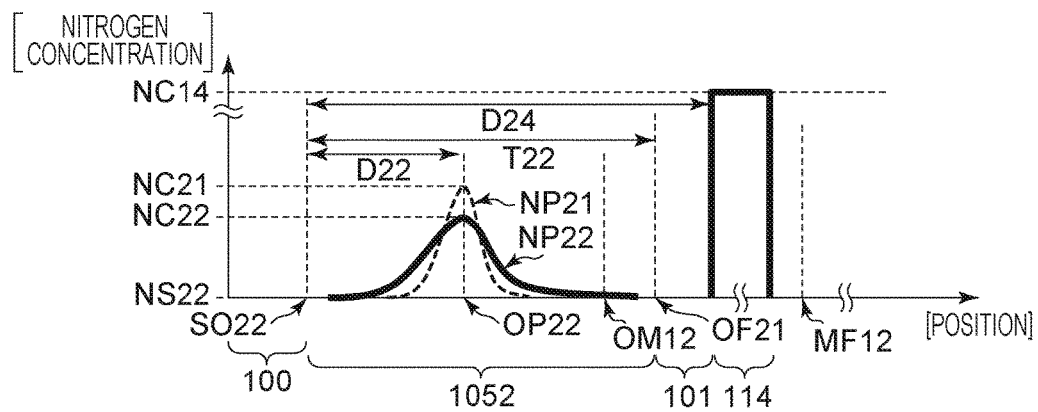

The nitrogen containing region 110 is described in detail. FIGS. 4A and 4B illustrate nitrogen distributions NP11 and NP12 in the range corresponding to the IVA, IVB-IVA, IVB line in FIG. 2. FIGS. 4C and 4D illustrate nitrogen distributions NP21 and NP22 in the range corresponding to the IVC, IVD-IVC, IVD line in FIG. 2.

FIGS. 4A and 4C illustrate the nitrogen distributions in the thickness direction in the vicinity of the silicon oxynitride film 150 during the manufacturing of the semiconductor device AP. FIG. 4A illustrates the nitrogen distribution NP11 of the insulating portion 1501 immediately after the process β. FIG. 4C illustrates the nitrogen distribution NP21 of the extending portion 1502 immediately after the process β.

FIGS. 4B and 4D illustrate the nitrogen distributions in the thickness direction in the vicinity of the silicon oxynitride film 105 in the completed semiconductor device AP. FIG. 4B illustrates the nitrogen distribution NP12 of the insulating portion 1051. FIG. 4D illustrates the nitrogen distribution NP22 of the extending portion 1052.

In FIG. 4A, a position SO11 indicates the position of the interface between the silicon layer 100 and the insulating portion 1501 and a position OM11 indicates the interface between the silicon oxynitride film 150 and the transfer electrode 107. The nitrogen distribution NP11 indicates a nitrogen concentration NS11 (interface nitrogen concentration) at the position SO11. In FIG. 4A, a position OP11 indicates the position where the nitrogen distribution NP11 indicates a nitrogen concentration NC11 which is the largest value (i.e. the global maximum value, the maximal value) of the nitrogen concentration within the insulating portion 1501 of the silicon oxynitride film 150. The nitrogen concentration NC11 is also the maximum value (i.e. the local maximum value) indicated by the nitrogen distribution NP11 at the position OP11. In FIG. 4A, a position MF11 indicates the position of the interface (upper surface of the transfer electrode 107) between the transfer electrode 107 and the insulating member 1091.

In FIG. 4B, a position SO21 indicates the position of the interface between the silicon layer 100 and the insulating portion 1051 and a position OM12 indicates the interface between the silicon oxynitride film 105 and the transfer electrode 107. The nitrogen distribution NP12 indicates a nitrogen concentration NS12 (interface nitrogen concentration) at the position SO12. In FIG. 4B, the position OP12 indicates the position where the nitrogen distribution NP12 indicates an NC12 which is the largest value of the nitrogen concentration within the insulating portion 1051 of the silicon oxynitride film 105. The nitrogen concentration NC12 is also the maximum value shown by the nitrogen distribution NP12 at the position OP12. In FIG. 4B, a position MF12 indicates the position of the interface (upper surface of the transfer electrode 107) between the transfer electrode 107 and the insulating member 1091.

In FIG. 4C, a position SO21 indicates the position of the interface between the silicon layer 100 and the extending portion 1502. The nitrogen distribution NP21 indicates a nitrogen concentration NS21 (interface nitrogen concentration) at the position SO21. In FIG. 4C, a position OP21 indicates the position where the nitrogen distribution NP21 indicates a nitrogen concentration NC21 which is the largest value of the nitrogen concentration within the extending portion 1502 of the silicon oxynitride film 150. The nitrogen concentration NC21 is also the maximum value indicated by the nitrogen distribution NP21 at the position OP21. In FIG. 4C, a position OF21 indicates the position of the upper surface which is an exposed surface of the extending portion 1502. FIG. 4C also indicates the positions OM11 and MF11 for comparison.

The nitrogen concentration distributions of the silicon oxynitride films 150 and 105 can be measured using X-ray photoelectron spectroscopy (XPS), secondary ion mass spectrometry (SIMS), inductively coupled plasma mass spectrometry (ICP-MS), Rutherford backscattering spectrometry (RBS), and the like. As an SIMS device, IMS-4F (Type) manufactured by Cameca Instruments and SIMS6650 manufactured by ULVAC-PHI (Type) are usable. Even when XPS measurement is performed by RVX1000 (Type) manufactured by ReVera, the nitrogen concentration distribution obtained by SIMS measurement and the nitrogen concentration distribution obtained by XPS measurement show satisfactory coincidence. The interface between the silicon oxynitride film 150 and the silicon layer 100 which is the surface of the silicon layer 100 and is the undersurface of the silicon oxynitride films 150 and 105 can be specified based on the relationship between the oxygen concentration and the silicon concentration. In the composition change in a direction toward the silicon oxynitride films 150 and 105 from the silicon layer 100, the ratio of the oxygen concentration to the silicon concentration may sharply decrease at the interface between the silicon oxynitride films 150 and 105 and the silicon layer 100. The relationship between the oxygen concentration and the silicon concentration can be grasped from the oxygen concentration distributions in the silicon oxynitride films 150 and 105. The oxygen concentration distribution in the silicon oxynitride films 150 and 105 can be measured by secondary ion mass spectrometry (SIMS). Specifically, the position where the secondary ion intensity of the oxygen detected in the SIMS measurement shows ½ of the highest intensity (peak intensity) can be determined as the interface between the silicon oxynitride films 150 and 105 and the silicon layer 100. However, the silicon oxynitride films 150 and 105 may have oxygen concentration distributions without clear peaks. For example, a region where the oxygen concentration reaches the highest concentration may extend with a fixed width in the thickness direction.

In FIG. 4D, a position SO22 indicates the position of the interface between the silicon layer 100 and the extending portion 1052. The nitrogen distribution NP22 indicates a nitrogen concentration NS22 (interface nitrogen concentration) at the position SO22. In FIG. 4D, the position OP22 indicates the position where the nitrogen distribution NP22 indicates a NC22 which is the largest value of the nitrogen concentration within the extending portion 1502 of the silicon oxynitride film 150. The nitrogen concentration NC22 is also the maximum value shown by the nitrogen distribution NP22 at the position OP22. In FIG. 4D, a position OF21 indicates the position of the upper surface which is an exposed surface of the extending portion 1502. FIG. 4D also illustrates the positions OM12 and MF12 described above for comparison.

The nitrogen concentration NS22 at the interface between the extending portion 1052 and the silicon layer 100 is lower than the nitrogen concentration NS12 at the interface between the insulating portion 1051 and the silicon layer 100 (NS22<NS12). In the interface between the silicon layer 100 and the silicon oxynitride film 105, charges originating from the interface state are likely to be generated and the charges are likely to be taken into the photoelectric conversion portion PD as a noise. By reducing the nitrogen concentration NS22, such a noise can be reduced.

In the nitrogen containing region 110 formed by the thermally oxynitriding method, the nitrogen concentrations NS11, NS12, and NS21 may be 0.01 at % or more. In the nitrogen containing region 110 formed by the plasma nitriding method, the nitrogen concentrations NS11, NS12, and NS21 may be less than 0.1 at %. On the other hand, the nitrogen concentration NS22 is less than 0.1 at % irrespective of the thermally oxynitriding method and the plasma nitriding method. This is because the silicon oxide portion 120 in which the nitrogen concentration is less than 0.1 at % can grow on the surface of the silicon layer 100 by the oxidation in the process γ.

The nitrogen concentrations NC11, NC12, NC21, and NC22 illustrated in FIGS. 4B and 4D are, for example, 0.01 at % or more and preferably 0.05 at % or more. The nitrogen concentrations NC11, NC12, NC21, and NC22 are, for example, 10 at % or less, preferably 5 at % or less and, more preferably 1 at % or less. By suppressing the nitrogen concentrations NC11, NC12, NC21, and NC22 to the above-described degrees, a noise which may arise within the silicon layer 100 can be reduced.

FIG. 4D illustrates the nitrogen distribution NP21 for comparison with the nitrogen distribution NP22. The nitrogen concentration NC22 is equal to or less than the nitrogen concentration NC21 (NC22≤NC21). The nitrogen of the nitrogen containing region 110 may be spread into the silicon oxynitride film 150 or the silicon oxide portion 120 by the heat in the oxidation of the process γ. In connection with the growth of the silicon oxide portion 120, a substitution reaction of nitrogen and oxygen progresses. Then, typically, the nitrogen concentration NC22 becomes lower than the nitrogen concentration NC11 (NC22<NC11). The half breadth (thickness of the region equal to or larger than the half of the nitrogen concentration NC22) of the nitrogen distribution NP22 becomes larger than the NP21, so that nitrogen distribution of nitrogen distribution NP22 becomes broad. The same (NC12<NC11) applies also to the insulating portion 1501 and an insulating portion 2051. However, under the transfer electrode 107, changes in the nitrogen concentrations in the insulating portions 1501 and 2051 are smaller than changes in the nitrogen concentrations in the extending portions 1502 and 1052 (NC21−NC22<NC11−NC12) corresponding to the fact that the growth of the silicon oxide portion 120 does not occur. As a result, the nitrogen concentration NC22 of the nitrogen concentration in the extending portion 1052 becomes lower than the nitrogen concentration NC12 of the nitrogen concentration in the insulating portion 1051 (NC22<NC12). The half breadth of the nitrogen distribution NP22 becomes larger than the half breadth (thickness of the region equal to or larger than the half of the nitrogen concentration NC12) of the nitrogen distribution NP12.

The nitrogen of the silicon oxynitride film 105 is likely to generate charges originating from fixed charges and the charges are likely to be taken into the photoelectric conversion portion PD as a noise. By reducing the nitrogen concentration NC22, such a noise can be reduced.

The nitrogen concentration NC14 of the silicon nitride layer 114 illustrated in FIGS. 4A and 4B is higher than the nitrogen concentrations NC12 and NC22 (NC14>NC12, NC22). The nitrogen concentration NC14 is, for example, 40 at % or more and 80 at % or less and preferably 50 at % or more and 70 at % or less. The silicon nitride layer 114 having a higher nitrogen concentration than that of the silicon oxynitride film 105 as described above is useful as an antireflection layer or a hydrogen supply source. By disposing the silicon nitride layer 114 having a high nitrogen concentration so as to satisfy at least any one of D24>T22, D24>T12, and D24<TM, the noise characteristics can be inhibited while receiving merits obtained by providing the silicon nitride layer 114.

According to an examination of the present inventors, when the silicon oxide portion 120 is provided, there is a possibility that white defects can be reduced by as much as 40% or more as compared with a case where the silicon oxide portion 120 is not provided. Moreover, according to an examination of the present inventors, a dark current can be sharply reduced by providing the extending portion 1052 as compared with a case where the extending portion 1052 is not provided. As described above, the method for growing silicon oxide under the extending portion 1052 after forming the electrode demonstrates an outstanding effect on a photoelectric conversion portion PD of a photoelectric conversion device. However, the method is also effective for semiconductor devices other than the photoelectric conversion device, and particularly in a semiconductor device having an analog circuit, an improvement of the noise characteristics can be expected.

Next, the peripheral transistor PTR illustrated in FIG. 2 is described. The peripheral transistor PTR of this example is a P-type MOS transistor but an N-type MOS transistor can be provided as another peripheral transistor PTR. A CMOS circuit can be configured by a P-type MOS transistor and an N-type MOS transistor.

In the peripheral region PRR, an N-type impurity region 227 serving as a well of the peripheral transistor PTR is provided. The peripheral transistor PTR has a gate electrode 207 and a P-type source/drain region 216. The side surface of the gate electrode 207 is covered with a sidewall spacer 212. The sidewall spacer 212 has a multilayer structure containing a silicon oxide layer 213, a silicon nitride layer 214, and a silicon oxide layer 215. Under the sidewall spacer 212, a P-type impurity region 211 is provided. The impurity region 211 has an impurity concentration lower than that of the source/drain region 216 and forms an LDD structure. On the source/drain region 216, a silicide layer 217 containing cobalt silicide, nickel silicide, or the like is provided. On the gate electrode 207, a silicide layer 218 containing cobalt silicide, nickel silicide, or the like is provided. An insulator film 220 covers the silicide layers 217 and 218 and the sidewall spacer 212. The insulator film 220 is a multilayer film of a silicon oxide layer and a silicon nitride layer or a single layer film of a silicon nitride layer, for example. The insulator film 220 is located between the silicon layer 100 and the interlayer insulating film 300. The insulator film 220 is overlapped with the dielectric film 112, which shows that the dielectric film 112 is partially located between the insulator film 220 and the element isolation portion 103. A contact plug 303 penetrates the interlayer insulating film 300 and the insulator film 220 to contact the silicide layer 217. A contact plug 304 penetrates the interlayer insulating film 300 and the insulator film 220 to contact the silicide layer 218.

Between the gate electrode 207 and the silicon layer 100, a silicon oxynitride film 205 as a gate insulating film is disposed. The thickness of the silicon oxynitride film 205 can be made smaller than that of the insulating portion 1051 and an insulating portion 2061. Thus, the working speed (drive frequency) of the peripheral circuit can be improved.

A method for manufacturing the semiconductor device AP which is a photoelectric conversion device is described with reference to FIGS. 5A to 5D to 7I to 7L.

FIGS. 5A to 7L illustrate the flow of the manufacturing method in the order of processes a to l. FIGS. 5A to 7L illustrate that a pixel region PXR and a peripheral region PRR are adjacent to each other for description. In the pixel region PXR, a transfer transistor which is an n-type MOS transistor is formed. In the peripheral region PRR, a peripheral transistor which is a p-type MOS transistor is formed. An amplification transistor SF which is an n-type MOS transistor in the pixel region PXR is formed by the same process as that of the transfer transistor. An n-type MOS transistor in the pixel region PXR is formed by the same process as that of the p-type MOS transistor.

In a process of preparing a substrate, a substrate having the silicon layer 100 is prepared first. The substrate is a silicon wafer and the silicon layer 100 may be an epitaxial layer. The element isolation portion 103 (field oxide film) is formed with an STI structure or a LOCOS structure in the silicon layer 100. Then, the impurity region 117 serving as a well of a second conductivity type (p-type) is formed by ion implantation in the silicon layer 100 through a silicon oxide film (pad oxide film) as a protective film. Similarly, the impurity region 227 serving as a well of a first conductivity type (n-type) is formed by ion implantation. Furthermore, the impurity region 101 of a first conductivity type (n-type) serving as a charge accumulation region of the photoelectric conversion portion PD is formed in the silicon layer 100 by ion implantation. Thus, a substrate is prepared.

Figure 5A:
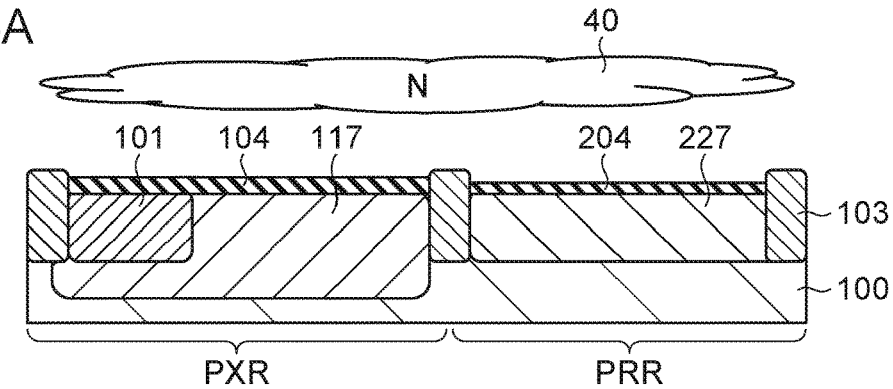
FIGS. 5A to 5D are schematic views explaining the method for manufacturing the semiconductor device, according to one or aspects of the current disclosure.

In the process a illustrated in FIG. 5A, the pad oxide film is removed, and then a silicon oxide film 104 serving as the base of the silicon oxynitride film 105 and a silicon oxide film 204 serving as the base of the silicon oxynitride film 205 are formed. For example, by performing thermal oxidation of the silicon layer 100 by a wet method herein, the silicon oxide films 104 and 205 serving as the base are formed.

The film thickness of the silicon oxide film 104 serving as the base of the silicon oxynitride film 105 for a 3.3 V transistor is 5 to 10 nm and, for example, 7.5 nm. The film thickness of the silicon oxide film 204 serving as the base of a silicon oxynitride film 250 for a 1.2 V transistor is 1 to 5 nm and, for example, 2.1 nm. For example, the thick silicon oxide film 104 is formed in the pixel region PXR and the peripheral region PRR, and then the thick silicon oxide film 104 is removed from the peripheral region PRR while leaving the same in the pixel region PXR. Thereafter, the thin silicon oxide film 204 is formed in the peripheral region PRR. The orders of the formation of the thick silicon oxide film 104 and the formation of the thin silicon oxide film 204 may be reversed.

Thereafter, as the conditions of nitriding processing for nitriding both the thick silicon oxide film 104 and the thin silicon oxide film 204, both the films are formed by a thermally oxynitriding method herein. According to the thermally oxynitriding method, the silicon oxide films 104 and 204 serving as the base are exposed to an atmosphere 40 of 800 to 1000° C. containing nitrogen atoms formed into dinitrogen monoxide ($N_2O$) or nitrogen monoxide (NO). Thus, by supplying oxygen and nitrogen to the surface of the silicon layer 100 through the silicon oxide films 104 and 204 is oxynitrided.

Figure 5B:
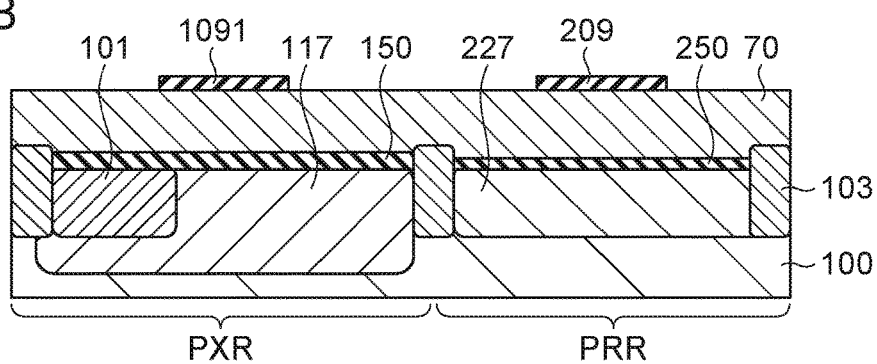

FIG. 5B illustrates the silicon oxynitride film 150 in the pixel region PXR and the silicon oxynitride film 250 in the peripheral region PRR formed by the nitriding processing. When the nitriding processing is carried out by the thermally oxynitriding method, the nitrogen profiles of the silicon oxynitride films 150 and 250 have a shape having a peak (largest value, maximum value) of the nitrogen concentration near the interface between the silicon oxynitride film 150 and the silicon layer 100 (FIGS. 4A to 4D). The largest value of the nitrogen concentration is about 0.05 to 0.2 atm % in the silicon oxynitride film 150 and about 0.7 to 2.2 atm % in the silicon oxynitride film 250. Even when the nitriding processing is simultaneously performed, the largest nitrogen concentration varies. This is because the nitrogen supply amount to the surface of the silicon layer 100 varies depending on the thickness of the silicon oxide films 104 and 204 themselves. The nitriding processing for the thick silicon oxide film 104 and the nitriding processing for the thin silicon oxide film 104 may be separately performed.

As another method for the nitriding processing, a technique by plasma nitriding is also mentioned. In this case, nitriding is performed by exposing the silicon oxide films 104 and 105 serving as the base to a nitrogen plasma atmosphere of about 400° C. When formed by the technique, a profile having a peak of the nitrogen concentration near the surface of the silicon oxynitride films 150 and 250 is obtained. When a micronized MOS transistor is used for the peripheral circuit, such a silicon oxynitride film as a gate insulating film contributes to inhibition of an increase in a tunnel current or inhibition of penetration of boron in a gate electrode. However, on the other hand, when the nitrogen in the silicon oxynitride film is formed on the surface of the silicon layer 100 on the photodiode, a degradation of the surface state of the silicon layer 100 is caused, resulting in deterioration in the noise characteristics of a sensor.

In the process b illustrated in FIG. 5B, an electrode material film 70, such as polysilicon, serving as a gate electrode is formed on the silicon oxynitride films 150 and 250. Furthermore, an inorganic material film containing inorganic insulating materials, such as silicon oxide, or inorganic electroconductive materials, such as a metallic compound, is formed on the electrode material film 70. Herein, the inorganic material film contains an inorganic insulating material. Thereafter, the inorganic material film is patterned with a resist mask to form a plurality of insulating members 1091, 1092, and 209 (the insulating member 1092 is not illustrated) serving as a hard mask on the electrode material film 70. When an inorganic electroconductive material is used as an inorganic material film, a plurality of electroconductive members serving as a hard mask are formed in place of the insulating members 1091, 1092, and 209.

Figure 5C:
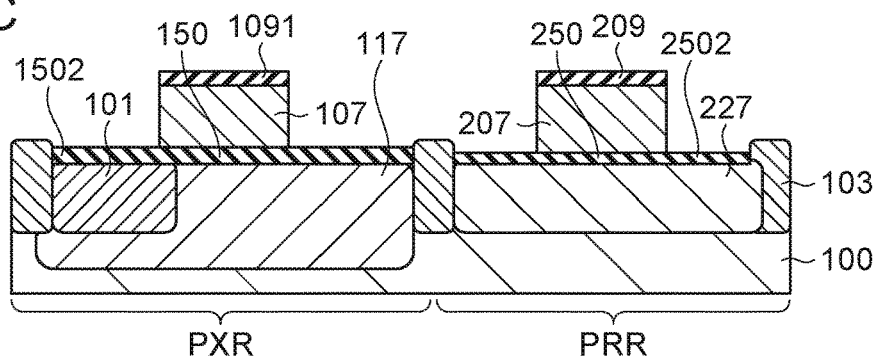

In the process c illustrated in FIG. 5C, the electrode material film 70 is etched using the insulating members 1091, 1092, and 209 (The insulating member 1092 is not illustrated.) as a hard mask to pattern the electrode material film 70. Thus, a plurality of electrodes containing the transfer electrode 107 and the gate electrodes 207 and 108 (The gate electrode 108 is not illustrated) are formed. In the process c, the thick silicon oxynitride film 150 formed by subjecting the thick silicon oxide film 104 to the nitriding processing is located between the transfer electrode 107 and the gate electrode 108 (not illustrated) and the silicon layer 100. In the process c, the thin silicon oxynitride film 250 formed by subjecting the thin silicon oxide film 204 to the nitriding processing is located between the gate electrode 207 and the silicon layer 100. The thickness of the silicon oxynitride film 150 is larger than the thickness of the silicon oxynitride film 250.

On the silicon layer 100 after forming the transfer electrode 107 and the gate electrode 207, the silicon oxynitride films 150 and 250 remain as the extending portion 1502 and an extending portion 2502 in regions other than regions under the transfer electrode 107 and the gate electrode 207. In particular, it is important that the silicon oxynitride film 150 remains as the extending portion 1502 on the impurity region 101 serving as the photoelectric conversion portion PD. In the etching of the electrode material film 70, conditions where the selectivity with the silicon oxynitride films 150 and 250 is high are usually used. Therefore, in the overetching of the electrode material film 70, the silicon oxynitride films 150 and 250 are etched only by 20% at most, and, for example, about 10% thereof. In this case, about 6.7 nm or more of the silicon oxynitride film 150 in the pixel region PXR remains.

Figure 5D:
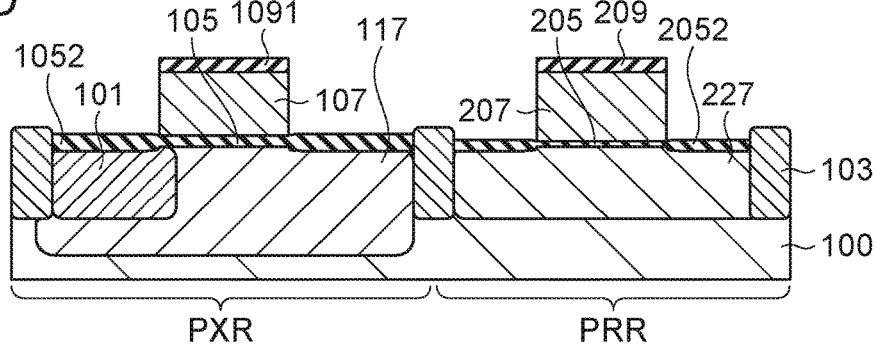

Next, in the process d illustrated in FIG. 5D, thermal oxidation is performed while leaving the silicon oxynitride films 150 and 250 immediately above the silicon layer 100 after etching the electrode material film 70. In the process d, the silicon layer 100 is oxidized (re-oxidized) through the extending portion 1052 of the silicon oxynitride film 150 located immediately under the transfer electrode 107 and the gate electrode 108 (not illustrated) in the pixel region PXR. The silicon layer 100 is oxidized (re-oxidized) through the extending portion 2052 of the silicon oxynitride film 250 located immediately under the gate electrode 207 in the peripheral region PRR. By the oxidation, the silicon oxide portion 120 (FIGS. 3A to 3C) is formed between the silicon layer 100 and the nitrogen containing region 110 (FIGS. 3A to 3C) in the silicon oxynitride film 150. As a result, the silicon oxynitride film 105 containing the silicon oxide portion 120 and the silicon oxynitride film 150 located immediately above the silicon layer 100 is formed. The nitrogen of the silicon oxynitride film 105 can be shifted from the silicon layer 100 side to the surface side. Thus, a degradation of the noise characteristics which may occur by the nitrogen can be inhibited. Similarly, a silicon oxide portion is formed also between the silicon layer 100 and the nitrogen containing region (FIGS. 3A to 3C) in the silicon oxynitride film 250.

The film thickness of the silicon oxide portion 120 (FIGS. 3A to 3C) growing by the re-oxidation is, for example, about 5 to 20 nm. A larger thickness is better and the silicon oxide portion 120 is formed with about 10 nm herein, for example. In the thermal oxidation method, it is preferable to form the silicon oxide portion 120 at about 800° C. to 1200° C. by RTO in which oxidation is enabled at a relatively high temperature for a short time. The silicon layer 100 is not exposed on the impurity region 101 after the patterning of the gate electrode, and therefore the occurrence of contamination or damages of the impurity region 101 can be prevented. It is considered that, when the patterning of the electrode material film 70 is performed by plasma etching, damages by the plasma are generated in the silicon layer 100. Crystal defects generated by the damages of the silicon layer 100 originating from the plasma etching of the electrode material film 70 are taken into the silicon oxide portion 120 by the thermal oxidation processing, whereby the recovery from the crystal defects can be achieved.

The impurity region 101 is formed by implantation of ions into a deep portion of the silicon layer 100 at relatively high implantation energy (acceleration energy). By forming the impurity region 101 before the formation of the silicon oxide film 104 as in this example, damages of the silicon oxide film 104 can be prevented and the silicon oxide portion 120 can be appropriately grown. Moreover, the damages generated in the vicinity of the surface of the silicon layer 100 in the ion implantation of the formation of the impurity region 101 can also be reduced by the formation of the silicon oxide portion 120 and the noise characteristics in the photoelectric conversion portion PD can be improved. It is also preferable to similarly form the impurity regions 117 and 227 formed as a well up to a deep portion of the silicon layer 100 before the formation of the silicon oxide films 104 and 204.

The method for forming the silicon oxynitride films 150 and 250 by the plasma nitriding method also has an effect of shifting the nitrogen of the silicon oxynitride films 105 and 205 in the direction of separating from the silicon layer 100 by the oxidation, and therefore has an effect on the noise characteristics.

Figure 6E:
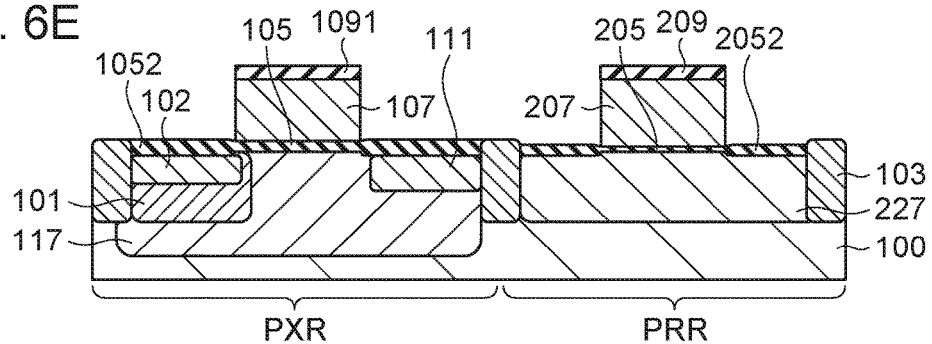
FIGS. 6E to 6H are schematic views explaining the method for manufacturing the semiconductor device, according to one or aspects of the current disclosure.

In a process e illustrated in FIG. 6E, the p-type impurity region 102 serving as the surface region of the silicon layer 100 is formed between the n-type impurity region 101 serving as a charge accumulation region and the silicon oxynitride film 105 through the silicon oxynitride film 105 formed in the process d. An impurity region 111 having a low impurity concentration of the first conductivity type (n-type) serving as the single drain structure in the pixel region PXR is formed. The impurity regions 102 and 111 are formed by implanting ions into the silicon layer 100 through the extending portion 1052 of the silicon oxynitride film 105.

The impurity region 102 is formed by implanting ions into a shallow portion of the silicon layer 100 at relatively low implantation energy (acceleration energy). Therefore, in order to reduce contamination or damages of the surface of the silicon layer 100, it is preferable that the surface of the silicon layer 100 is covered with a protective film in the ion implantation. The silicon oxynitride film 105 thickened by the silicon oxide portion 120 functions as a protective film in the formation of the impurity region 102. Therefore, the impurity region 102 is preferably formed after the process d. The same applies to the impurity region 111. However, the impurity region 102 may be formed through the silicon oxynitride film 150 between the process c and the process d. In that case, there is a merit that the recovery from damages of the silicon layer 100 generated in the ion implantation in the formation of the impurity region 102 can be achieved by re-oxidation treatment.

Figure 6F:
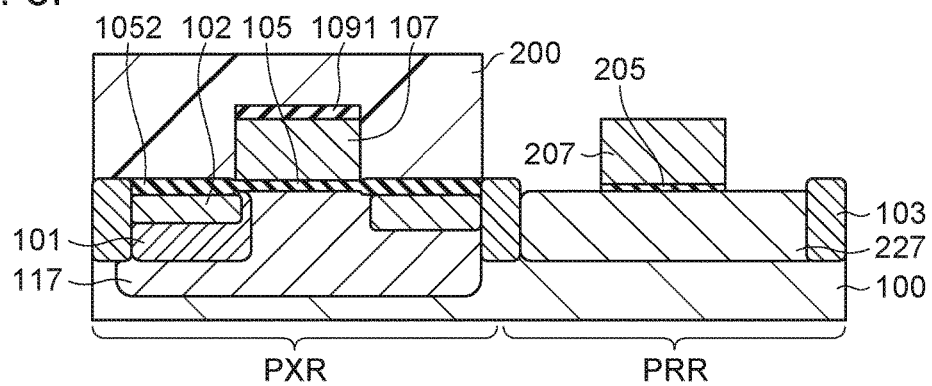

In a process f illustrated in FIG. 6F, the extending portion 2052 extending from between the gate electrode 207 and the silicon layer 100 of the silicon oxynitride film 205 in the peripheral region PRR is removed by wet etching or the like. The extending portion 2052 of the silicon oxynitride film 205 is located on portions other than a portion immediately under the gate electrode 207 on an active region. The removal of the extending portion 2052 of the silicon oxynitride film 205 is preferably performed so that the silicon layer 100 is exposed but the silicon oxynitride film 205 may partially remain on the silicon layer 100. At this time, by masking the pixel region PXR with a mask member 200, such as resist, the extending portion 1052 extending from between the transfer electrode 107 and the silicon layer 100 of the silicon oxynitride film 105 is left. The extending portion 1062 (FIG. 2) extending from between the gate electrode 108 and the silicon layer 100 of the silicon oxynitride film 106 formed as a gate insulating film of the amplification transistor SF is also similarly masked with a mask member 200, such as resist, to be left. An insulating member 209 containing silicon oxide is also removable in the process f.

Figure 6G:
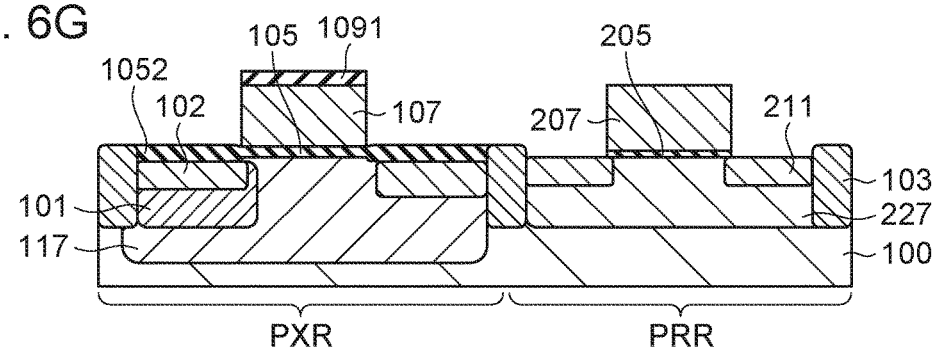

In a process g illustrated in FIG. 6G, the impurity region 211 having a low impurity concentration serving as the LDD structure is formed. The impurity region 211 is formed by introducing impurities into the silicon layer 100 by ion implantation using the gate electrode 207 as a mask. For the impurity region 211 having a low impurity concentration of the PMOS transistor, boron difluoride ($BF_2$), boron (B), or indium (In) is used, for example. The dose amount is set to $1\times10^{13}/cm^2$ to $1\times10^{15}/cm^2$, for example. In the case of boron, the acceleration energy is set to about 0.5 KeV to 10 KeV. For the impurity region having a low impurity concentration of the NMOS transistor, arsenic (As) or phosphorus (P) is used, for example. The dose amount is set to $1\times10^{13}/cm^2$ to $1\times10^{15}/cm^2$, for example. In the case of arsenic, the acceleration energy is set to about 3 KeV to 20 KeV.

The process g is performed after leaving the silicon oxynitride film 105 in the pixel region PXR and the silicon oxynitride film 205 in the peripheral region PRR is partially removed by the process f as described above. Thus, the ion implantation of the impurity region 211 can be controlled under conditions where a shallow LDD required for the peripheral transistor PTR which is required to perform high-speed operation can be realized. Therefore, both a high-speed transistor having driving force in the peripheral region PRP and excellent noise characteristics in the pixel region PXR serving as a sensor can be achieved.

Figure 6H:
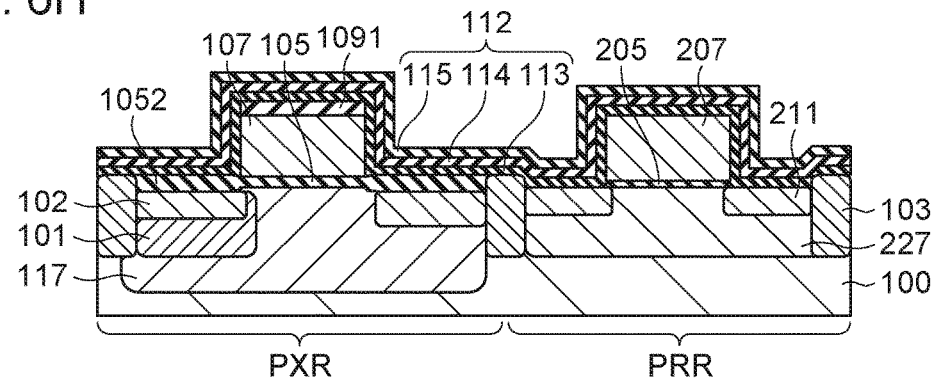

In a process h illustrated in FIG. 6H, the dielectric film 112 which is a laminated film of the silicon oxide layer 113, the silicon nitride layer 114, and the silicon oxide layer 115 is formed in the pixel region PXR and the peripheral region PRR. The dielectric film 112 covers the extending portion 1052 of the silicon oxynitride film 105 extending from between the transfer electrode 107 and the silicon layer 100. The dielectric film 112 contacts the silicon oxynitride film 105. The dielectric film 112 also covers the gate electrode 108 (not illustrated) and the gate electrode 207.

Figure 7I:
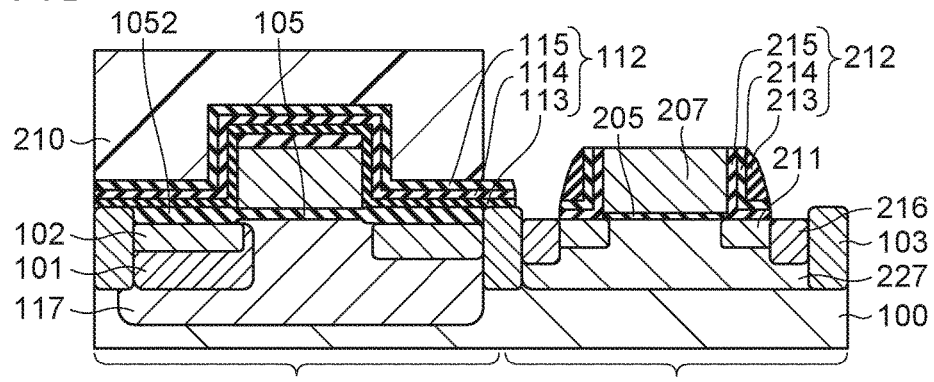
FIGS. 7I to 7L are schematic views explaining the method for manufacturing the semiconductor device, according to one or aspects of the current disclosure.

In a process i illustrated in FIG. 7I, the dielectric film 112 is etched using a mask member 210, such as photoresist, disposed on a portion covering the extending portion 1052 of the dielectric film 112 as a mask. Thus, a sidewall spacer 212 covering the side surface of the gate electrode 207 is formed from the dielectric film 112. The sidewall spacer 212 has the laminated structure of the silicon oxide layer 213, the silicon nitride layer 214, and the silicon oxide layer 215. By leaving the dielectric film 112 in the pixel region PXR, damages in the etching of the dielectric film 112 can be prevented from entering a pixel transistor, such as the amplification transistor SF, and the noise characteristics can be improved.

Furthermore, resist is formed in the pixel region PXR, and then the source/drain region 216 which is self-aligned with the sidewall spacer 212 is formed in the peripheral region PRR.

Figure 7J:
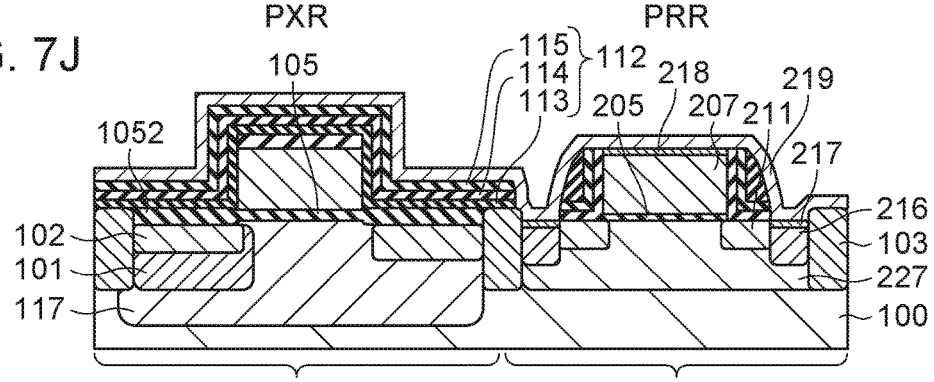

In a process j illustrated in FIG. 7J, a metal film 219 of cobalt, nickel, or the like is formed on the dielectric film 112 left in the pixel region PXR and on the source/drain region 216 and the gate electrode 207. The metal film 219 and the single crystal silicon of the source/drain region 216 and the polysilicon of the gate electrode 207 and the metal of the metal film 219 are individually made to react with each other by heat treatment. Thus, silicide layers 217 and 218 of the metal contained in the metal film 219 are formed in the peripheral transistor PTR. At this time, the dielectric film 112 is brought into a state of covering the extending portion 1052, the transfer electrode 107, and the gate electrode 108 to thereby function as a silicide protection film. Therefore, no silicide layer is formed in the pixel region PXR. Thus, white defects originating from the silicide in the pixel region PXR can be reduced. The insulating member 209 is removed in the process f before this process, and therefore the silicide layer 218 can be formed. Thereafter, the metal film 219 remaining in the pixel region PXR without reacting is removed.

Figure 7K:
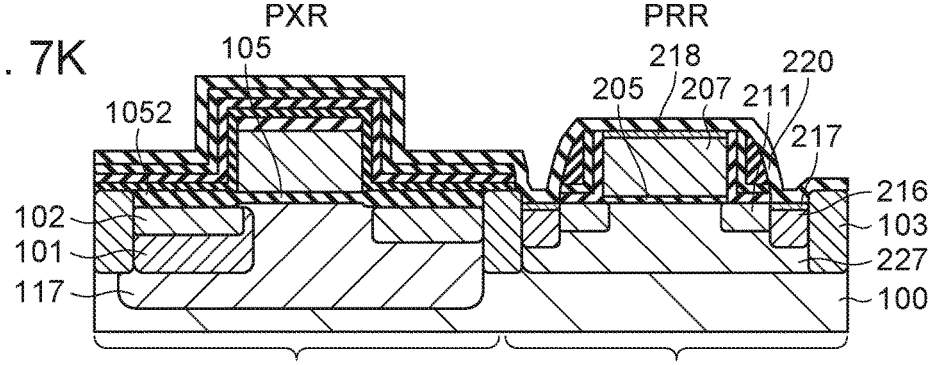

In a process k illustrated in FIG. 7K, the insulator film 220 which is a laminated film of a silicon oxide layer and a silicon nitride layer is formed on the entire surface. The insulator film 220 may function as a diffusion preventing film of the metals of the silicide layers 217 and 218.

Figure 7L:
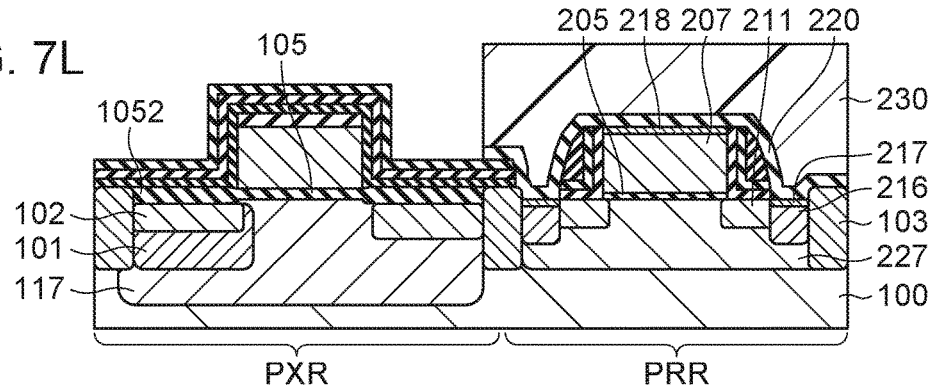

In a process l illustrated in FIG. 7L, the insulator film 220 located in the pixel region PXR is removed using a mask member 230, such as photoresist, as a mask so that the insulator film 220 remains in the peripheral region PRR.

Thereafter, as illustrated in FIG. 2, the interlayer insulating film 300 is formed, and then contact holes are formed using the dielectric film 112 and the insulator film 220 as an etching stopper. Contact plugs are formed in the contact holes, so that the wiring layer 310 is formed. Other wiring layers and interlayer insulating films are further formed. A color filter array or a microlens array is formed on a multilayer wiring structure containing the plurality of wiring layers.

Thereafter, a wafer having the silicon layer 100 is diced to be divided into a plurality of semiconductor chips ICs. Each of the plurality of semiconductor chips ICs is accommodated in a package PKG, and then electrically connected to the package PKG by wire bonding or the like, so that the semiconductor device AP is completed.

The configuration other than the pixel circuit UNT of the semiconductor device AP is described with reference to FIG. 1A. The semiconductor device AP can have a peripheral circuit PRC. The peripheral circuit PRC may contain a vertical drive circuit VDC for driving a plurality of pixel circuits UNTs, a signal processing circuit SPC processing signals obtained from the plurality of pixel circuits UNTs, and a horizontal scanning circuit HSC for successively outputting the signals processed by the signal processing circuit SPC. The peripheral circuit PRC may further contain an output circuit OPC outputting signals generated by the signal processing circuit SPC. The peripheral circuit PRC may contain a control circuit CC for controlling the vertical drive circuit VDC, the signal processing circuit SPC, and the horizontal scanning circuit HSC. The signal processing circuit SPC can contain a CDS (correlation double sampling) circuit, an amplification circuit, and AD (analog-digital) conversion circuit. The control circuit CC can contain a timing generator. The vertical drive circuit VDC and the horizontal scanning circuit HSC can contain a shift register and an address decoder. The output circuit OPC can contain an LVDS driver. In the semiconductor chip IC, the peripheral circuit PRC may be disposed in the peripheral region PRR located around the pixel circuits UNTs. However, at least one part of the vertical drive circuit VDC, the signal processing circuit SPC, the horizontal scanning circuit HSC, the control circuit CC, and the output circuit OPC can also be provided in another semiconductor chip different from the semiconductor chip having the plurality of pixel circuits UNTs. The other semiconductor chip and the semiconductor chip having the plurality of pixel circuits UNTs can also be laminated.

The image pickup system SYS illustrated in FIG. 1B may be an electronic device, such as an information terminal, having a camera and a photographing function. Moreover, the image pickup system SYS may be a transport device, such as a vehicle, a ship, or a flight vehicle. The image pickup system SYS as a transport device is suitable for those transporting the semiconductor device AP or those assisting and/or automating driving (operation) by the photographing function.

The semiconductor device AP can also further have not only the semiconductor chip IC but the package PKG accommodating the semiconductor chip IC. The package PKG may contain a base substance to which the semiconductor chip IC is fixed, a lid body, such as glass, facing the semiconductor chip IC, and a connection member, such as a bonding wire or a bump, connecting a terminal provided in the base substance and a terminal provided in the semiconductor chip IC.

The optical system OU forms an image on the semiconductor device AP, and is a lens, a shutter, or a mirror, for example. The control device CU controls the semiconductor device AP and is a semiconductor device, such as an ASIC, for example. The processing device PU is one processing signals output from the semiconductor device AP and is a semiconductor device, such as a CPU or an ASIC, for configuring an AFE (analog front end) or a DFE (digital front end). The display DU is an EL display device or a liquid crystal display device displaying an image obtained by the semiconductor device AP. The storage device MU is a semiconductor device or a magnetic device memorizing an image obtained by the semiconductor device AP and is a volatile memory, such as an SRAM or a DRAM, or a nonvolatile memory, such as a flash memory or a hard disk drive.

As described above, this embodiment is the semiconductor device AP having the photoelectric conversion portion PD and the transfer portion TX transferring charges of the photoelectric conversion portion PD. The semiconductor device AP has the silicon layer 100 having the photoelectric conversion portion PD, the transfer electrode 107 of the transfer portion TX disposed on the silicon layer 100, and the insulator film 105. The insulator film 105 has the insulating portion 1051 located between the transfer electrode 107 and the silicon layer 100 and the extending portion 1052 located on the photoelectric conversion portion PD. The insulating portion 1051 of the insulator film 105 and the extending portion 1052 contain nitrogen, oxygen, and silicon. The distance D22 between the position OP22 where the nitrogen concentration shows the largest value in the extending portion 1052 and the silicon layer 100 is larger than the distance D12 between the position OP12 where the nitrogen concentration shows the largest value in the insulating portion 1051 and the silicon layer 100.

This embodiment is also a method for manufacturing the semiconductor device AP and includes forming a plurality of electrodes including the transfer electrode 107 and the gate electrode 207 on the silicon oxynitride films 150 and 250 (the insulator films) containing nitrogen, oxygen, and silicon disposed on the silicon layer 100. After forming the plurality of electrodes, silicon oxide is grown between the silicon oxynitride films 150 and 250 (the insulator films) and the silicon layer 100.

The embodiments are advantageous in improving the noise characteristics of the semiconductor device AP. The above-described embodiments can be altered as appropriate without deviating from the idea of the present disclosure. The contents of the disclosure of this specification include not only matters stipulated in this specification but matters which can be read from the attached drawings even when not stipulated in this specification.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-231769, filed Nov. 29, 2016 which is hereby incorporated by reference herein in its entirety.

What is claimed is:

1. A semiconductor device comprising:
a silicon layer having a photoelectric conversion portion;
a transfer electrode of a transfer portion disposed on the silicon layer, the transfer portion transferring a charge of the photoelectric conversion portion; and
an insulator film having a first portion located between the transfer electrode and the silicon layer and a second portion located on the photoelectric conversion portion, wherein
the first portion and the second portion of the insulator film contain nitrogen, oxygen, and silicon,
a distance between a position where a nitrogen concentration shows a largest value in the second portion and the silicon layer is larger than a distance between a position where a nitrogen concentration shows a largest value in the first portion and the silicon layer, and
the largest value of the nitrogen concentration in the second portion is lower than the largest value of the nitrogen concentration in the first portion.

2. The semiconductor device according to claim 1, wherein
a thickness of the second portion is larger than a thickness of the first portion.

3. The semiconductor device according to claim 1, wherein
nitrogen is continuously distributed between the first portion and the second portion.

4. The semiconductor device according to claim 1, comprising a silicon nitride layer which is disposed on the silicon layer,
wherein the transfer electrode is disposed between the silicon nitride layer and the silicon layer,
the first portion is located between the silicon nitride layer and the photoelectric conversion portion, and
a distance between the silicon nitride layer and the silicon layer is smaller than a thickness of the transfer electrode.

5. The semiconductor device according to claim 4 comprising:
a charge holding portion to which the charge is transferred by the transfer portion; and
an amplification transistor having a gate electrode connected to the charge holding portion, wherein
the silicon nitride layer extends so that the gate electrode of the amplification transistor is located between the silicon nitride layer and the silicon layer.

6. The semiconductor device according to claim 1 comprising:
a peripheral circuit performing at least one of driving of the pixel circuit containing the photoelectric conversion portion and the transfer portion and processing of a signal output from the pixel circuit and containing a MOS transistor is provided, wherein
a thickness of a gate insulating film of the MOS transistor is smaller than the thickness of the first portion.

7. A system comprising:
the semiconductor device according to claim 1; and
at least any one of an optical system forming an image on the semiconductor device, a control device controlling the semiconductor device, a processing device processing a signal output from the semiconductor device, a display device displaying information obtained by the semiconductor device, and a storage device storing the information obtained by the semiconductor device.

8. A semiconductor device comprising:
a silicon layer having a photoelectric conversion portion;
a transfer electrode of a transfer portion disposed on the silicon layer, the transfer portion transferring a charge of the photoelectric conversion portion; and
an insulator film having a first portion located between the transfer electrode and the silicon layer and a second portion located on the photoelectric conversion portion, wherein
the first portion and the second portion of the insulator film contain nitrogen, oxygen, and silicon,
a distance between a position where a nitrogen concentration shows a largest value in the second portion and the silicon layer is larger than a distance between a position where a nitrogen concentration shows a largest value in the first portion and the silicon layer, and
a nitrogen concentration at an interface between the second portion and the silicon layer is lower than a nitrogen concentration at an interface between the first portion and the silicon layer.

9. The semiconductor device according to claim 8, wherein
the largest value of the nitrogen concentration in the second portion is lower than the largest value of the nitrogen concentration in the first portion.

10. A system comprising:
the semiconductor device according to claim 8; and
at least any one of an optical system forming an image on the semiconductor device, a control device controlling the semiconductor device, a processing device processing a signal output from the semiconductor device, a display device displaying information obtained by the semiconductor device, and a storage device storing the information obtained by the semiconductor device.

11. The semiconductor device according to claim 8, wherein
a thickness of the second portion is larger than a thickness of the first portion.

12. The semiconductor device according to claim 8, wherein
nitrogen is continuously distributed between the first portion and the second portion.

13. The semiconductor device according to claim 8, comprising a silicon nitride layer which is disposed on the silicon layer,
wherein the transfer electrode is disposed between the silicon nitride layer and the silicon layer,
the first portion is located between the silicon nitride layer and the photoelectric conversion portion, and
a distance between the silicon nitride layer and the silicon layer is smaller than a thickness of the transfer electrode.

14. The semiconductor device according to claim 13 comprising:
a charge holding portion to which the charge is transferred by the transfer portion; and
an amplification transistor having a gate electrode connected to the charge holding portion, wherein
the silicon nitride layer extends so that the gate electrode of the amplification transistor is located between the silicon nitride layer and the silicon layer.

15. The semiconductor device according to claim 8 comprising:

a peripheral circuit performing at least one of driving of the pixel circuit containing the photoelectric conversion portion and the transfer portion and processing of a signal output from the pixel circuit and containing a MOS transistor is provided, wherein
a thickness of a gate insulating film of the MOS transistor is smaller than the thickness of the first portion.

16. A semiconductor device comprising:
a silicon layer having a photoelectric conversion portion;
a transfer electrode of a transfer portion disposed on the silicon layer, the transfer portion transferring a charge of the photoelectric conversion portion;
a charge holding portion to which the charge is transferred by the transfer portion;
an amplification transistor having a gate electrode connected to the charge holding portion;
an insulator film having a first portion located between the transfer electrode and the silicon layer and a second portion located on the photoelectric conversion portion;
an insulator film having a third portion located between the gate electrode of the amplification transistor and the silicon layer;
a fourth portion located on a source/drain region of the amplification transistor, wherein
the first portion and the second portion of the insulator film contain nitrogen, oxygen, and silicon,
a distance between a position where a nitrogen concentration shows a largest value in the second portion and the silicon layer is larger than a distance between a position where a nitrogen concentration shows a largest value in the first portion and the silicon layer,
the third portion and the fourth portion contain nitrogen, and
a thickness of the fourth portion is larger than a thickness of the third portion.

17. The semiconductor device according to claim 16, wherein a nitrogen concentration at an interface between the second portion and the silicon layer is lower than a nitrogen concentration at an interface between the first portion and the silicon layer.

18. The semiconductor device according to claim 16, wherein the largest value of the nitrogen concentration in the second portion is lower than the largest value of the nitrogen concentration in the first portion.

19. The semiconductor device according to claim 16 comprising:
a peripheral circuit performing at least one of driving of the pixel circuit containing the photoelectric conversion portion and the transfer portion and processing of a signal output from the pixel circuit and containing a MOS transistor is provided, wherein
a thickness of a gate insulating film of the MOS transistor is smaller than the thickness of the first portion.

20. A system comprising:
the semiconductor device according to claim 16; and
at least any one of an optical system forming an image on the semiconductor device, a control device controlling the semiconductor device, a processing device processing a signal output from the semiconductor device, a display device displaying information obtained by the semiconductor device, and a storage device storing the information obtained by the semiconductor device.

* * * * *